United States Patent [19]

Cass

[11] Patent Number: 4,518,911
[45] Date of Patent: May 21, 1985

[54] CABLE TEST APPARATUS

[75] Inventor: James L. Cass, Northridge, Calif.

[73] Assignee: Perkins Research & Mfg. Co., Inc., Canoga Park, Calif.

[21] Appl. No.: 459,134

[22] Filed: Jan. 19, 1983

[51] Int. Cl.³ ............................................. G01R 31/08
[52] U.S. Cl. ..................................................... 324/52
[58] Field of Search .................................. 324/51, 52; 179/175.3 F; 361/80, 81, 85

[56] References Cited

U.S. PATENT DOCUMENTS 3,904,839  9/1975  Peoples ..................... 179/175.3 F
4,251,766  2/1981  Souillard .............................. 324/52

Primary Examiner—Stanley T. Krawczewicz
Attorney, Agent, or Firm—Poms, Smith, Lande & Rose

[57] ABSTRACT

A test apparatus for use with cables of the type used in telephone circuits comprising a plurality of two-wire conductive pairs exhibiting fixed resistance and capacitance per unit length. The apparatus can be used to locate a high resistance short involving two conductive wires. A precision a.c. signal or tone at a continuous, fixed frequency is applied to the wires. The phase angle resulting from the conductive and resistive portions of current flowing in the wires relative to the applied signal is determined. Current flow is sensed inductively and the presence of the conductive pair of interest is determined to be at those locations where the measured phase angle is substantially identical. In determining the location of a high resistance short, the current in the pair is sensed along its length and the point of the short is indicated as that point where the measured phase angle makes a substantial change. In the preferred embodiment, matched low-drift oscillator circuits are employed in the tone sending transmitter and the tone receiver. The two circuits are trimmed to be matched in frequency and phase prior to the beginning of the testing such that the two remain in sequence at least for the duration of the testing. The comparison of phase angle in the receiver is between the measured signal and the matched oscillator frequency.

9 Claims, 5 Drawing Figures

CABLE TEST APPARATUS

BACKGROUND OF THE INVENTION

The present invention relates to apparatus used for testing cables and, more particularly, to apparatus used for testing cables employed in telephone systems comprising a plurality of twisted-wire conductive pairs exhibiting fixed resistance and capacitance per unit length. The apparatus test for the location of a high resistance short between adjacent conductive wires.

Typically, a telephone cable comprises a bundle of twisted pairs (each pair comprises a "tip" and a "ring"). These cables may be buried in the ground, located in underground conduits, or supported overhead on telephone poles. Two types of conductor insulation is found in telephone cable. Older cables use paper insulation on each individual wire. In newer cables, each individual wire has plastic insulation. One common problem in telephone cables is the existence of a physical short between adjacent wires. In telephone jargon, a "short" occurs between two wires of the same pair, whereas a "cross" is between two wires of different pairs; the term "short" is used in the following description to refer to either of these conditions. A low resistance short can seriously affect or entirely disrupt communication over the pair; a high resistance short causes lesser, but still disturbing communication problems. Either of these shorts is commonly caused by the presence of moisture within the cable. With paper insulated conductors, the moist paper results in a high resistance short. With plastic insulation, there may be manufacturing defects in the insulation, referred to as "pin holes", which in the presence of contaminants and water can cause corrosion and a high resistant fault.

There are several methods for locating shorts. If the short is low resistance, i.e. 100 ohms or less, a fault locating technique known as "exploring" is commonly used. This approach is illustrated in FIG. 1. The cable 10 has a conductive pair 12 having a short 14. A tone generator 16 applies an audio tone to the pair 12 which may be picked up through an inductive sensor 18. The sensor is usually connected to an amplifier and a head set so that the craftsman may listen to the tone being picked up from the pair. At position "A", the sensor 18 picks up a tone signal of a relatively strong intensity. At point "B", however, which is past the short 14 (as measured from the tone generator 16), the tone which is picked up has a lesser intensity since the majority of the current is shunted through the short 14, whereby little current appears at point "B" and a dramatic change in signal level is heard. While this approach works quite satisfactorily for low resistance shorts, a resistance of several thousand ohms, for example, 3,000 ohms in a typical cable, will result in a change in signal volume undetectable to the craftsman.

If the resistance is high, i.e. 3,000 ohms and above, there are, in practice, three methods for attempting to locate the fault. In the first method, the craftsman attempts to product a "hard" fault, i.e., reduce the resistance of the fault. This is done through the use of a "breakdown" test set that applies a 700 volt, 5 amp direct current to the pair having the fault. The high resistance short acts like a resistive heater which can burn away the paper insulation from the conductors and "weld" the two wires together producing a lower resistance short which can then located as above with the exploring method. There are two problems in using the breakdown test set. First, there are safety problems in working with the high voltage source, to the craftsman and, unless all drop wires which are connected to the pair are removed in the section being "burned", the high voltage may also result in damage to a subscriber's premises or to the subscriber personally. Second, the method does not work satisfactorily with plastic insulated conductors because the causing of a breakdown at the fault requires even higher voltage than with paper insulation and it is possible to create a new fault at a second location during the attempted "burning".

A second common technique for locating a high resistance fault is the use of a resistance bridge. Various types of modified Wheatstone bridges have been used in the telephone industry over the years; one type is used for the specific application of fault location. The bridge method involves basic techniques which are well known in the art. There are, however, several problems with the bridge technique. One of the principal problems is that these devices do not precisely locate the fault but are rather approximate indicators of the fault location. Despite increased accuracy of modern bridges, there is still a need for precise location since opening the cable is a laborious and costly undertaking. Another difficulty with the use of a resistance bridge is that it requires the craftsman to go to the far end (a point beyond the fault) to "strap" the faulted wires to form the bridge; this procedure, of course, costs time and money.

The third method for locating high resistance faults utilizes time domain reflectometry; the equipment is often referred to as a cable "radar" test set. This method is also well known in the art but has its unique problems. One is the craftsman expertise that is required to interpret signal displays to identify faults and further to measure the distance to the fault. Furthermore, there is the problem of precision as with the above-described resistance bridge technique.

It is therefore the object of the present invention to provide a method and apparatus for testing cables for the location of a high resistance short which is easy to use and highly accurate.

SUMMARY

The foregoing objectives have been met by the method of the present invention for detecting the location of a high resistance short between the conductors of a two-wire conductive pair exhibiting fixed resistance and capacitance per unit length comprising the steps of applying a continuous, fixed a.c. signal or tone to the conductive pair at an exposed location; inductively sensing the current flow from the a.c. signal in the pair adjacent the point of applying the a.c. signal; determining the phase angle resulting from the resistive and capacitive portions of the sensed current flow in the pair relative to the a.c. signal; inductively sensing the current flow along the conductive pair; determining the phase angle of the sensed current flow at points along the conductive pair; comparing the phase angles along the conductive pair to that at the point of applying the a.c. signal; and indicating the location of the short at the point where the phase angle changes substantially.

The apparatus of the present invention for accomplishing the foregoing method comprises means for applying a continuous, fixed a.c. signal or tone to a conductive pair; means for sensing the current flow in the pair from the signal; and means for determining the phase angle resulting from the resistive and capacitive components of the sensed current flow relative to the a.c. signal. In the preferred embodiment, there is also included means for comparing the phase angle of the applied signal to the phase angle resulting from the resistive and capacitive components of the sensed current flow, as well as means for signalling the passing over the location of a high resistance short when the applied signal phase angle and the sensed current phase angle begin to deviate by more than a pre-established amount.

To prevent the necessity for physical interconnection between the sending unit and the receiving unit, each unit employs an oscillator, which oscillators remain at identical frequencies and in phase correspondence at least for the duration of the testing. In the preferred embodiment, ovenized crystal oscillator circuits are temporarily interconnected and physically fine-tuned to a matching frequency just prior to the beginning of testing. In an alternate embodiment, the sending and receiving units both employ the carrier frequency of a local radio station as a frequency base.

DESCRIPTION OF THE PREFERRED EMBODIMENT

Those skilled in the telephone art will recognize, as mentioned above, that there is a differentiation in terminology between a "short" which exists between two wires that comprise a tip/ring pair and a "cross" which is also, in fact, a type of short, but one which is between a wire of a first tip/ring pair and a wire of a second tip/ring pair. The description which follows hereinafter is with respect to a short in a single tip/ring pair. The apparatus and method, however, will work equally well in detecting a high resistance cross. The scope and spirit of the specification and claims is intended to cover both cases.

Figure 1:
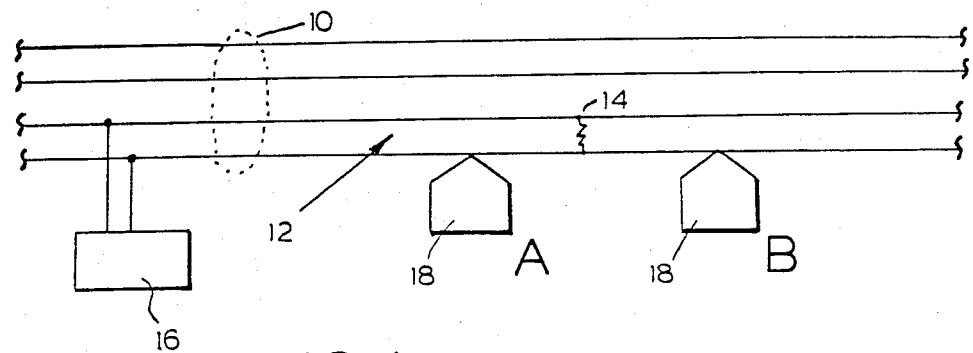
FIG. 1 is a simplified block diagram of a prior art approach to detecting shorts in a two-wire conductive pair.
Figure 2:
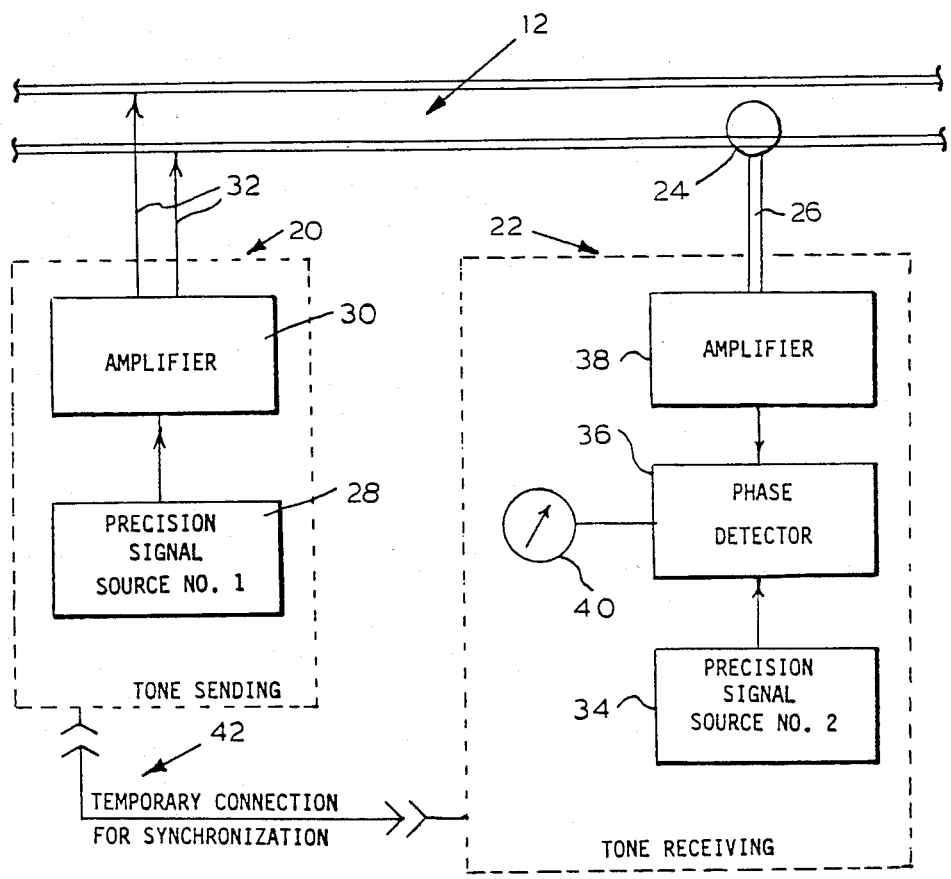
FIG. 2 is a simplified block diagram of the present invention.

Turning first to FIG. 2, the apparatus of the present invention is shown in its preferred embodiment in simplified block diagram form. The apparatus comprises a tone sending or transmitter portion, generally indicated by the dotted box 20, and a tone receiving portion or sensor, generally indicated by the dotted box 22. An inductive sensing coil 24 of a type well known in the art is operably connected to the tone receiving portion 22 by the cable 26. The inductive sensing coil 24 when placed adjacent a two-wire conductive pair (or two conducting wires) such as that indicated as 12 inductively senses any current flow therein and impresses a signal on the cable 26 which is sensed by the tone receiving portion 22.

Both the tone sending portion 20 and tone receiving portion 22 are powered by batteries (not shown). The tone sending portion 20 comprises a first precision signal source 28 connected to an amplifier 30 adapted to apply a tone signal to the pair 12 through wires 32.

The tone receiving portion 22 comprises a second precision signal source 34 connected to a phase detector 36; also included are an amplifier 38 connected to the cable 26 to amplify the signal from the sensing coil 24 and having an output also connected to the phase detector 36. The phase detector 36 is adapted to compare the phase angle of the current in pair 12 as sensed by the sensing coil 24 to the phase angle of the precision signal source 34. The difference is displayed on meter 40.

In use, temporary connection 42 is made between the tone sending portion 20 and the tone receiving portion 22. The precision signal sources 28, 34 are adjusted to be in synchronization and reset to be in phase. The temporary connection 42 is then removed. The wires 32 are then connected to the pair 12 (or the two "crossed" wires) of interest and the inductive sensing coil 24 moved along the pair for testing purposes. As will be discussed in greater detail hereinafter, the two precision signal sources 28, 34 are designed to stay in frequency and phase correspondence at least for the duration of a reasonable testing period. By so doing, no physical connection need be maintained between the tone sending portion 20 and the tone receiving portion 22. As the inductive sending coil 24 is moved along the pair 12, the phase detector 36 can check the phase angle of the sensed signal coming from amplifier 38 against the signal from the second precision signal source 34 which is the same as comparing it to the signal from the first precision signal source 28 which is being applied to the pair 12 since the two are in complete synchronization.

Figure 5:
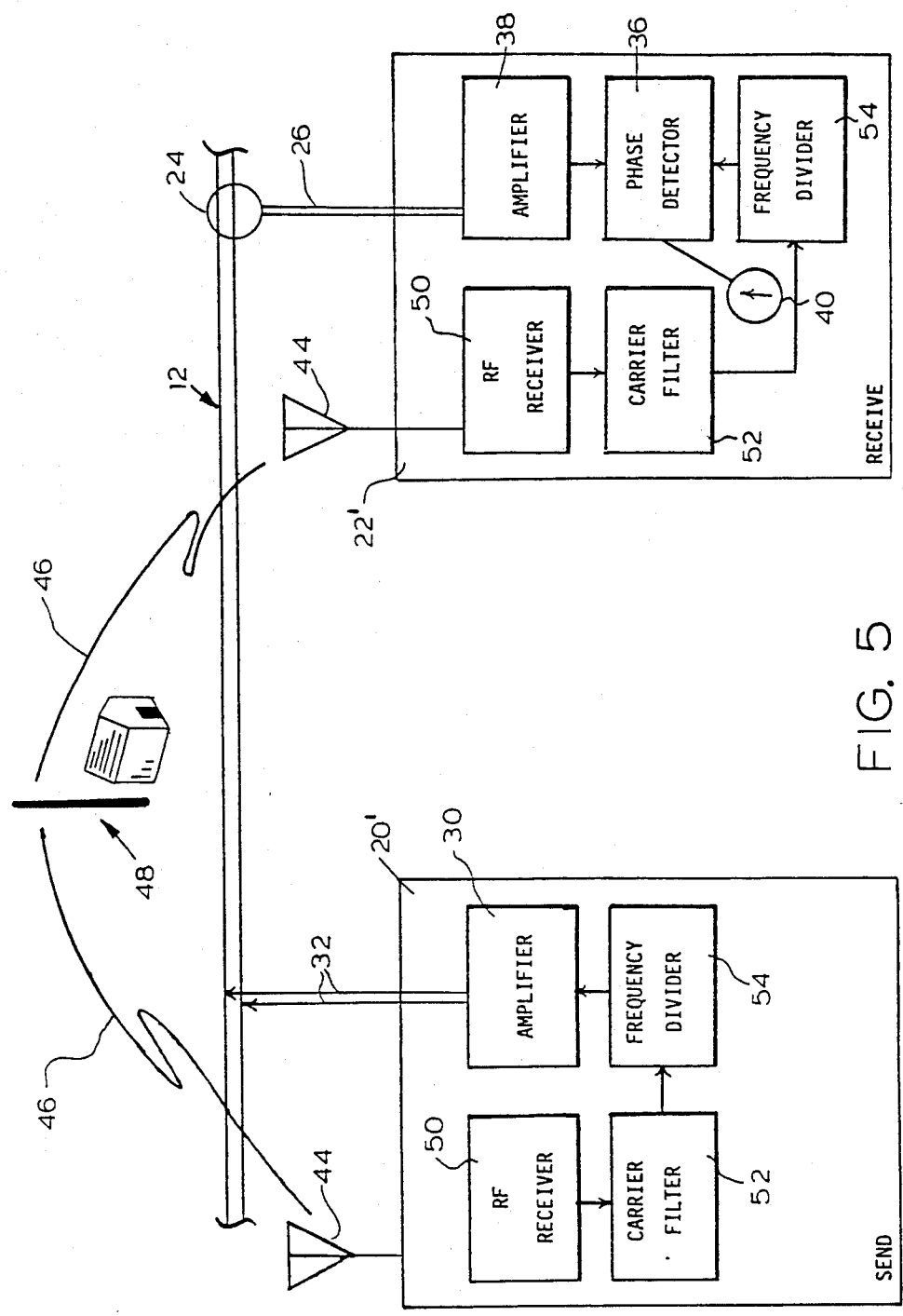
FIG. 5 is a block diagram of the present invention in an alternate embodiment.

Before the details of the preferred embodiment as built and tested are set forth in detail, reference should be made to FIG. 5 wherein an alternate embodiment of the present invention is shown in simplified block diagram form. The alternate embodiment of FIG. 5 comprises a tone sending portion 20' and a tone receiving portion 22'. In this embodiment, the tone sending portion still contains amplifier 30 and wires 32 for applying a tone to the two wires or two-wire pair 12 as with the previous embodiment. Likewise, the tone receiving portion 22' includes amplifier 38, phase detector 36, meter 40, and cable 26 connected to inductive sensing coil 24. As will be noted, what is missing are the precision signal sources 28, 34 and the temporary connection 42 for synchronization. Both the tone sending portion 20' and the tone receiving portion 22' in this embodiment contain an antenna 44 for receiving the signal 46 from a radio station, generally indicated as 48. The antenna 44 is connected to an RF receiver 50 which, in turn, is connected to a carrier filter 52, the output of which is fed as an input to a frequency divider 54. The output from the frequency divider 54 is used in the same manner as the output from the precision signal sources 28, 34 of the prior embodiment. The signal 46 from the radio station 48 is received by the antenna 44 in combination with the RF receiver 50. The carrier filter 52 accepts only the basic carrier frequency of the signal 46; that is, the modulation thereof containing the broadcast information is removed. The carrier frequency is then divided by the frequency divider 54 to a useful frequency for application with respect to the conductor pair 12. Since both the tone sending portion 20' and the tone receiving portion 22' are employing the identical signal, they are automatically in frequency synchronization; however, the tone phase synchronizing step previously required, while no longer strictly necessary with this embodiment, may be used to facilitate the observation of phase changes.

Figure 3:
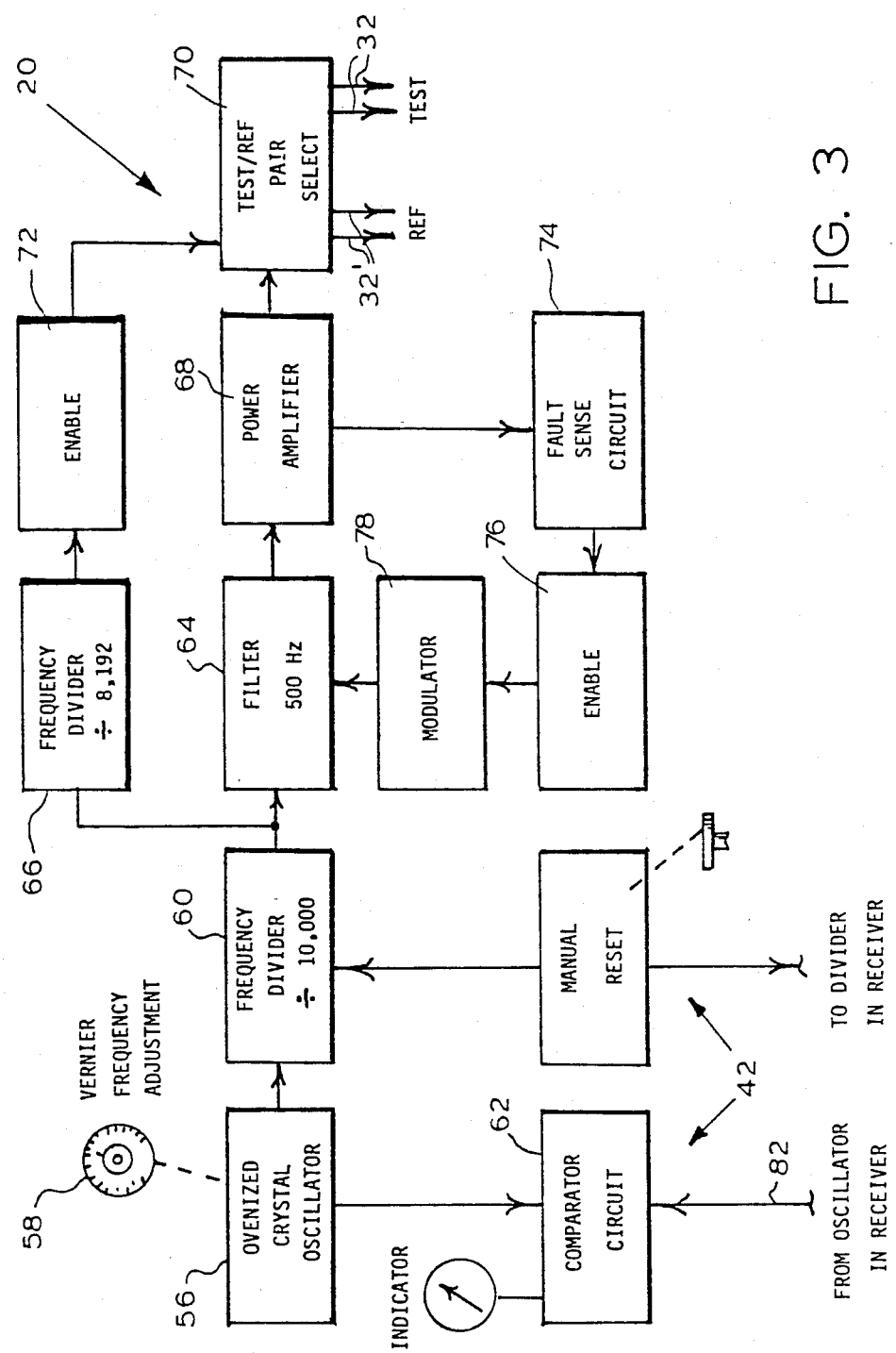
FIG. 3 is a block diagram of the sending unit according to the present invention in its preferred embodiment.

Turning now to FIG. 3, the tone sending portion 20 of the preferred embodiment in a form as built and tested is shown in greater detail. At 56 is an ovenized crystal oscillator having a vernier frequency adjustment 58 as part thereof. The crystal oscillator 56 is a high-precision, low-drift circuit operating nominally at 5 MHz (megahertz). The function of the vernier frequency adjustment 56 will be discussed shortly. The output from the crystal oscillator 56 is connected two places. One is a divide-by-10,000 frequency divider 60 and the other is a comparator circuit 62. The latter also will be discussed shortly. The output of the frequency divider 60 is at 500 Hz and is connected as an input to a 500 Hz filter 64 and another frequency divider 66 which divides by 8,192. The frequency divider 66 will also be discussed shortly.

The filter 64 removes all harmonic components from the divider output except the 500 Hz signal of interest. The output from the filter 64 is input to a power amplifier 68. One output from the power amplifier 68 is connected to a test/reference pair select circuit 70. The select circuit 70 has a first set of wires, being the wires 32, adapted to be connected to the conductor pair 12 being tested. A second pair of wires, 32', are provided for connection to a reference pair 12' for comparison if desired. An enable circuit 72 activated by the operator through, for example, a switch (not shown) enables the select circuit 70. When disabled at 72, the pair select circuit 70 continuously connects the "TEST" wires 32 to the power amplifier 68 such that the signal at 500 Hz is continuously applied to the pair 12 under test. When the enable circuit 72 is activated, the output of the frequency divider 66 alternates the signal from the power amplifier 68 between the "TEST" wires 32 and the "REF" wires 32' on a periodic basis.

The output from the power amplifier 68 is also connected to a fault sense circuit 74 which looks at the impedance of the pair 12 when the wires 32 are connected thereto. In the event that the fault sense circuit 74 does not see a high resistance short across the pair 12 under test, it activates enable circuit 76 which activates modulator 78 to impress a distinctive modulation tone upon the signal going into the power amplifier 68 through filter 64 such that it appears on the wires 32 and from there into the pair 12 to be sensed by the operator. This warning circuit prevents the operator from wasting time searching along a pair 12 for a high resistance short which has ceased to exist.

Figure 4:
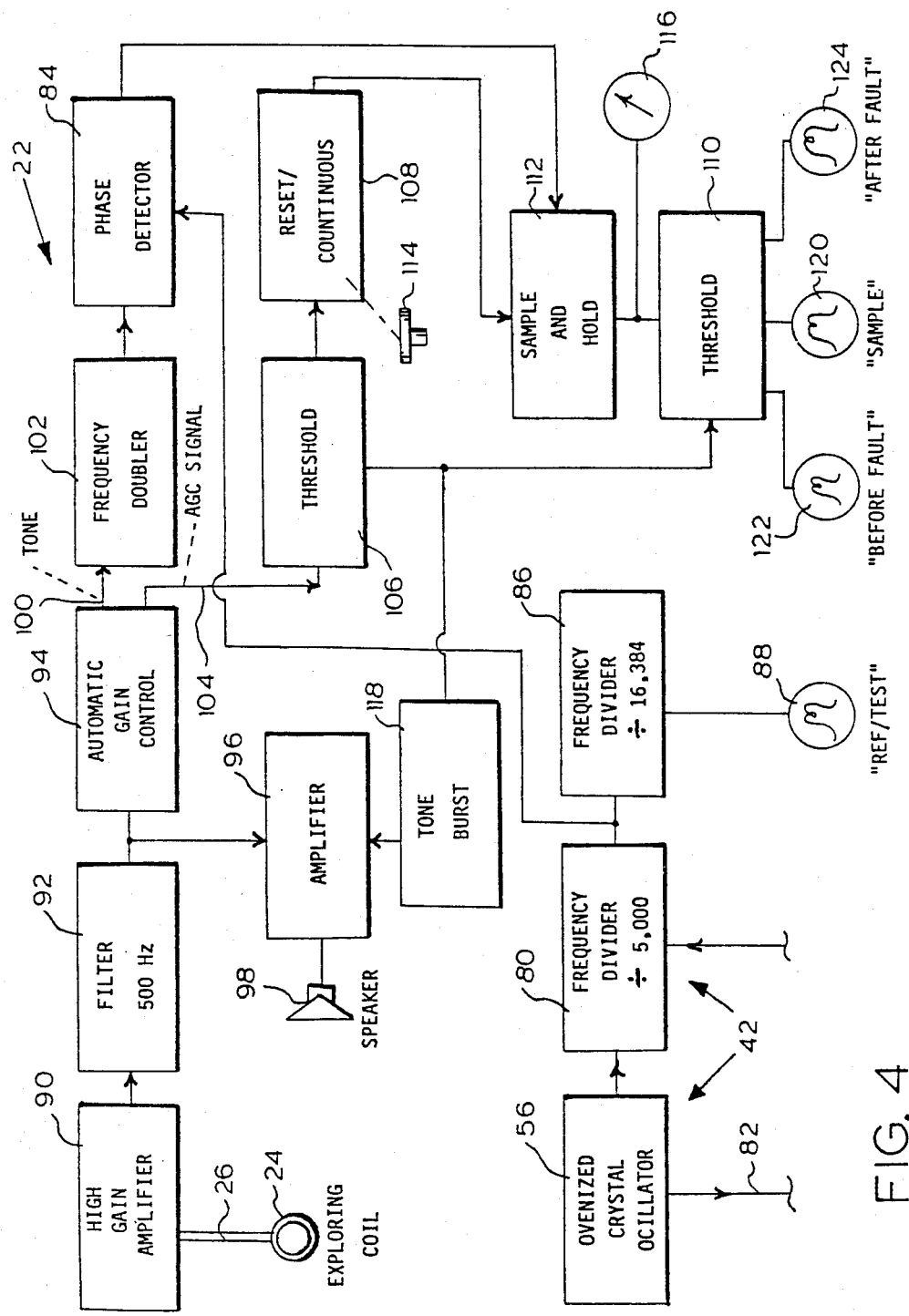
FIG. 4 is a block diagram of the receiving unit of the present invention in its preferred embodiment.

Turning now to FIG. 4, the tone receiving portion 22 is shown in its preferred embodiment as built and tested. Tone receiving portion 22 also contains an ovenized crystal oscillator 56. The ovenized crystal oscillator 56 of the tone receiving portion 22 does not contain the vernier frequency adjustment 58 since only one is necessary. If desired, the vernier frequency adjustment could be omitted from the oscillator 56 of the tone sending portion 20 and be incorporated within the oscillator 56 of the tone receiving portion 22. It is preferred that it be placed in the sending portion 20, however, since that device remains stationary whereas the receiving portion 22 is moved and, therefore, more likely to be jarred out of adjustment. The output from the crystal oscillator 56 of the receiving portion 22 is connected to a frequency divider 80 which divides by 5,000 and to the comparator circuit 62 of the tone sending portion 20 through a wire 82 contained within the temporary connection 42 used for synchronization in the manner to be described in greater detail hereinafter. It should be noted that the frequency divider 80 divides the 5 MHz (mega-hertz) oscillator frequency by 5,000 instead of 10,000 as did the frequency divider 60 in the tone sending portion 20. Thus, the output from the frequency divider 80 is double that of the frequency divider 60, or 1,000 Hz. As will be developed further hereinafter, this results in the possibility of a phase shift of 180° in the sensed signal being taken into consideration automatically. The output from the frequency divider 80 is connected first as one input to a phase detector 84, to be discussed shortly, and secondly as an input to a frequency divider 86 which divides by 16,384. It should be noted that the frequency divider 86 divides by twice the amount of the frequency divider 66 which controls the switching of the TEST-/REF pair select circuit 70 in the tone sending portion 20. The frequency divider 86 is connected to operate a "REF/TEST" lamp. With the two oscillators 56 synchronized, the operation of the pair select circuit 70 and the "REF/TEST" lamp 88 are synchronized. Thus, even when the "REF" wires 32' contain the signal from power amplifier 68, the "REF/TEST" lamp 88 is lit as an indication to the operator of what is being displayed whereas when the "TEST" wires 32 are connected to the power amplifier 68, the lamp 88 is extinguished.

The exploring or sensing coil 24 connects through wires 26 to a high-gain amplifier 90. The output from the amplifier 90 is connected to a 500 Hz filter 92 which removes everything but the signals of interest being sensed. The output from the filter 92 is connected to an automatic gain control (AGC) circuit 94 and to an audio amplifier 96 connected to a speaker 98. Thus, the basic tone as sensed is also heard by the operator on the speaker 98.

The AGC circuit 94 has two outputs. On line 100 is the tone as sensed, which is input to a frequency doubler circuit 102. On line 104 is the gain control signal, which is input to a first threshold circuit 106. Threshold circuit 106 and the circuit to which it is connected will be discussed shortly.

The frequency doubler 102 converts the 500 Hz signal into a 1000 Hz signal, which is input as the second input to the phase detector 84. Both inputs are now at 1000 Hz. Since the 500 Hz signal was doubled, a possible 180° out-of-phase condition in the 500 Hz signal is automatically compensated for. This 180° out-of-phase condition arises because of the two-sided construction of the exploring coil, and because of the twisting of wires in a typical cable.

Returning now to the first threshold circuit 106, that circuit determines the point at which a sample is taken for testing purposes. If the signal is too weak, the results could be non-determinative of the condition to be tested. Threshold circuit 106 assures that no testing will be done until the sensed signal being picked up by coil 24 is of sufficient strength to be determinative. The output of threshold circuit 106 is connected to a reset/-continuous circuit 108 and to a second threshold circuit 110. The reset/continuous circuit 108, in turn, is connected to control a sample-and-hold circuit 112. Phase detector circuit 84, in turn, develops at its output the difference between the phase angle of the sample due to the resistive and capacitive components of the current sensed by current 24 and the reference tone from oscillator 56 and frequency divider 80, which is synchronized to the oscillator 56 and frequency divider 60 in the tone sending portion 20. Under the control of operator button 114, the operator can set the mode of operation of the reset/continuous circuit and, in turn, the sample and hold circuit 112. In the continuous mode, the phase angle difference is continuously displayed on the meter 116 for visual comparison by the operator. In the reset mode, the output from the sample and hold circuit 112 is tested by the second threshold circuit 110. This is under the control of the second output from the first threshold circuit 106. When the signal strength is sufficiently high for a sample to be taken, the two outputs appear from the first threshold circuit 106. The one instructs the sample and hold circuit 112 to freeze and hold the present phase angle difference being input thereto. That value then appears continuously on the meter 116 and as input to the second threshold circuit 110. Simultaneously, the second output from the first threshold circuit 106 activates tone burst circuit 118, which is input to the amplifier 96 and which causes a distinguishable audible tone on the speaker 98 signaling to the operator that the sample has been taken. Simultaneously, the second output from the first threshold circuit 106 also activates the second threshold circuit 110 which illuminates a "SAMPLE" lamp 120 and either a "BEFORE FAULT" lamp 122 or an "AFTER FAULT" lamp 124 depending on whether the difference in the phase angles is less than or greater than a pre-established threshold amount. Thus, upon sampling, if the phase angle has not deviated more than the threshold amount of the second threshold circuit 110, it is assumed that any deviation is a minor deviation by the presence of tone current into the high resistance short in the line beyond the present location, and not between the tone sending portion 20 and the exploring coil 24. By contrast, when the phase angle difference has deviated by an amount substantial enough to indicate the absence of current into such a high resistive short, the threshold of second threshold circuit 110 is exceeded and the "AFTER FAULT" lamp 124 illumination indicates that the exploring coil 24 has passed the location of the high resistance short.

It will be appreciated by those skilled in the art that circuits peforming the functions described hereinbefore are all commercially available as off-the-shelf components and/or are easily fabricated without undue experimentation by those skilled in the art. Accordingly, no further details have been provided herein as they would only be redundant.

Wherefore, having thus described my invention, I claim:

1. A method for detecting the location of a high resistance short between two adjacent conductors exhibiting fixed resistance and capacitance per unit length comprising the steps of:
   (a) applying a continuous, fixed a.c. signal to the two conductors at an exposed location;
   (b) inductively sensing the current flow from the a.c. signal in the conductors adjacent the point of applying the a.c. signal;
   (c) determining the phase angle between the applied a.c. signal and the sensed current flow in the conductors;
   (d) inductively sensing the current flow along the conductors;
   (e) determining the phase angle resulting from the resistive and capacitive portions of the sensed current flow along the conductors;
   (f) comparing the phase angles determined in steps (c) and (e); and,
   (g) indicating the location of the short at the point where the phase angle changes substantially.

2. The method of claim 1 wherein:
   (a) the applying of an a.c. signal includes the step of deriving said signal from a first stable source of oscillation at a frequency f; and,
   (b) the deriving of the phase angle of the sensed current flow includes the step of generating a reference signal for comparison to the sensed current flow wherein said reference signal is derived from a second stable source of oscillation at the frequency f.

3. The method of claim 2 wherein:
said first and second sources of oscillation are the carrier frequency of a radio station which is sensed.

4. The method of claim 2 wherein:
   (a) said first source of oscillation is a first circuit including a low-drift crystal oscillating substantially at frequency f;
   (b) said second source of oscillation is a second circuit including a low-drift crystal oscillating substantially at frequency f; and wherein;
   (c) prior to practicing the method the first and second circuits are balanced to provide the same frequency in the same phase relationship during the test period.

5. Apparatus for testing two-wire conductive pairs exhibiting fixed resistance and capacitance per unit length, comprising:
   (a) means for applying a continuous, fixed a.c. signal to a conductive pair;
   (b) means for sensing the current flow in the pair from the signal;
   (c) means for determining the phase angle between the applied a.c. signal and the sensed current resulting from the resistive and capacitive components of the current flow; and
   (d) means for comparing the phase angle of the applied signal to the phase angle of the sensed current flow in the signal source.

6. The apparatus of claim 5 and additionally comprising:
means for signalling the passing of a high resistance short when said applied signal phase angle and said sensed current phase angle deviate ore than a pre-established amount.

7. The apparatus of claim 5 wherein:
   (a) said means for applying an a.c. signal includes a first stable source of oscillation at a frequency f; and,
   (b) said means for determining the phase angle of the sensed current flow includes means for generating a reference signal for comparison to the sensed current flow wherein said reference signal is derived from a second stable source of oscillation at the frequency f.

8. The apparatus of claim 7 wherein:
said first and second sources of oscillation are the carrier frequency of a radio station which is sensed.

9. The apparatus of claim 7 wherein:
   (a) said first source of oscillation is a first circuit including a low drift crystals oscillating substantially at frequency f;
   (b) said second source of oscillation is a second circuit including a low drift crystal oscillating substantially at frequency f; and additionally comprising,
   (c) synchronizing means for temporarily interconnecting said first and second circuits and for balancing said circuits to provide the same frequency in the same phase relationship prior to testing.

* * * * *